MEANS FOR CONTROLLING TEMPERATURE RISE
OF TEMPERATURE STABILIZED SUBTRATE
Filed Dec. 20, 1966

INVENTOR:
EDWARD N. JEFFREY

E. Mickey Hubbard
ATTORNEY

United States Patent Office 3,393,870
Patented July 23, 1968

3,393,870

MEANS FOR CONTROLLING TEMPERATURE RISE OF TEMPERATURE STABILIZED SUBSTRATES

Edward N. Jeffrey, Plano, Tex., assignor to Texas Instruments Incorporated, Dallas, Tex., a corporation of Delaware Filed Dec. 20, 1966, Ser. No. 603,351
1 Claim. (Cl. 236—78)

This invention relates generally to monolithic semiconductor circuits, and more particularly relates to a means for controlling the initial temperature rise of a temperature stabilized integrated circuit substrate to prevent a thermal runaway.

In U.S. Patent No. 3,383,614 issued May 14, 1968, assigned to the assignee of the present invention, a temperature stabilized semiconductor substrate of an integrated circuit is described and claimed. The substrate is maintained at a constant temperature in excess of the maximum design ambient by a plurality of heater transistors which are diffused into one end of the bar and which are automatically controlled by an amplifier which derives its input from the voltage drop across a plurality of temperature sensing diodes formed around a temperature control zone at the other end of the substrate. The temperature sensitive circuit or circuit components which are to be maintained at the same temperature are disposed in or on the temperature control zone.

In some instances, difficulties have been encountered in these temperature stabilized substrates as a result of thermal runaway when the substrate is first energized. When power is first applied to a room temperature substrate, the sensing diodes indicate that maximum power is required. As a result, the output from the amplifier is sufficient to saturate the heater transistors.

This results in one end of the substrate becoming very hot before the thermal energy can propagate to the other end of the substrate where the sensing diodes are located. If the heating transistors have a high capacity, the resulting high temperature is so great than even when the sensor and amplifier circuits become operative after the lag period required for the thermal energy to propagate down the substrate, the temperature cannot be reduced before the substrate is destroyed.

The object of thisinvention is to provide a means for preventing such a thermal runaway in a temperature stabilized substrate that is simple so as to occupy a minimum space on the substrate, yet effective at substantially all ambient temperatures without materially degrading the performance of the substrate.

In accordance with the present invention, maximum current to the heater transistors is limited to a safe value until such time as the sensor diodes and the amplifier circuit become operative due to heating of the sensor diodes. This is achieved by adding a start-up transistor to the circuit with the collector connected to the collector supply voltage, the emitter connected to a midpoint of the series of sensor diodes, and the base connected to the output of the amplifier. As a result, the output of the amplifier is held to a maximum value equal to the total of the $V_{BE}$ drops across the start-up transistor, the sensing diodes between the emitter of the transistor and the transistors in the amplifier. The initial voltage level at the output of the amplifier is selected so that the current through the heater transistors will be maintained at a safe level. Then as the thermal energy from the heaters reaches the diodes, the potential at the emitter of the transistor increases while the potential at the base of the transistor decreases until the base-emitter junction of the start-up transistor is reverse biased. Then the start-up transistor is effectively removed from the circuit.

The novel features believed characteristic of this invention are set forth in the appended claim. The invention itself, however, as well as other objects and advantages thereof, may best be understood by reference to the following detailed description of an illustrative embodiment, when read in conjunction with the accompanying drawings, wherein:

Figure 1:
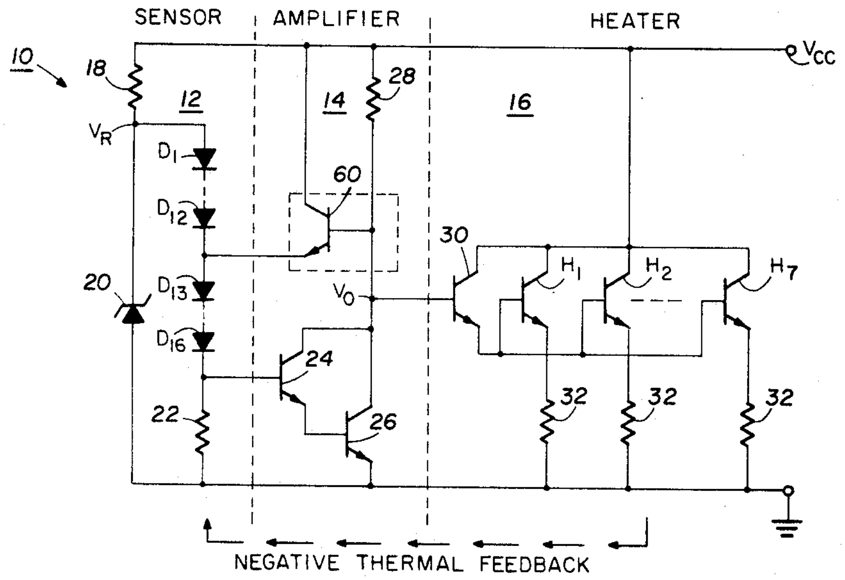
FIGURE 1 is a schematic circuit diagram of the sensor, amplifier and heater circuit of a temperature stabilized substrate incorporating the present invention.

Referring now to the drawings, a temperature control circuit for a temperature stabilized substrate constructed in accordance with the present invention is indicated generally by the reference numeral 10. The circuit 10 is comprised of a sensor section 12, a D.C. amplifier section 14, and a heater section 16. The sensor section 12 includes a current limiting resistor 18 and a Zener diode 20 which are connected in series across the collector voltage supply. The Zener diode 20 establishes a reference voltage at junction $V_R$ with respect to ground. Sixteen sensor diodes $D_1$–$D_{16}$ are connected in series with a resistor 22 between junction $V_R$ and ground. The output of the sensor section 12 is the junction between diode $D_{16}$ and resistor 22 which is connected to the base of transistor 24 which is the input of the amplifier section 14. Transistor 24 is connected in Darlington pair configuration with transistor 26. The collectors of transistors 24 and 26 are connected through a current limiting resistor 28 to the collector supply voltage. The collectors of transistors 24 and 26 form the output $V_O$ of the D.C. amplifier section 14 which is connected to drive the base of input transistor 30 which is the input of the heater section 16. Transistor 30 is connected in Darlington pair configuration with each of seven heater transistor $H_1$–$H_7$. The collector of input transistor 30 and the collectors of heater transistors $H_1$–$H_7$ are all connected to the collector supply voltage, and each emitter of the heater transistors $H_1$–$H_7$ is connected through a resistor 32 to the emitter supply voltage, which is typically ground.

Figure 3:
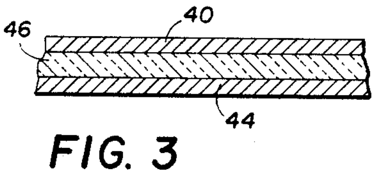
FIGURE 3 is a schematic sectional view showing the manner in which the temperature stabilized substrate of FIGURE 2 is mounted.
Figure 2:
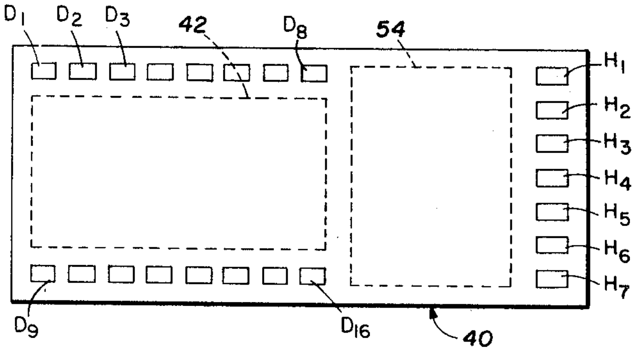
FIGURE 2 is a plan view of a typical temperature stabilized substrate in which the circuit of FIGURE 1 is incorporated.

The portion of the circuit 10 thus far described is disclosed in the above-referenced copending application. All of the circuit 10 is normally located on a common semiconductor substrate 40 (see FIGURE 2) with the heater transistors $H_1$–$H_7$ formed by conventional diffusion techniques in one end of the substrate, and the sensing diodes $D_1$–$D_{16}$ formed around a temperature control zone 42 at the other end of the substrate. The substrate 40 is then typically mounted on the base plate 44 of a typical integrated circuit header by a suitable electrically and thermally insulating material 46 in the manner illustrated in FIGURE 3.

Figure 4:
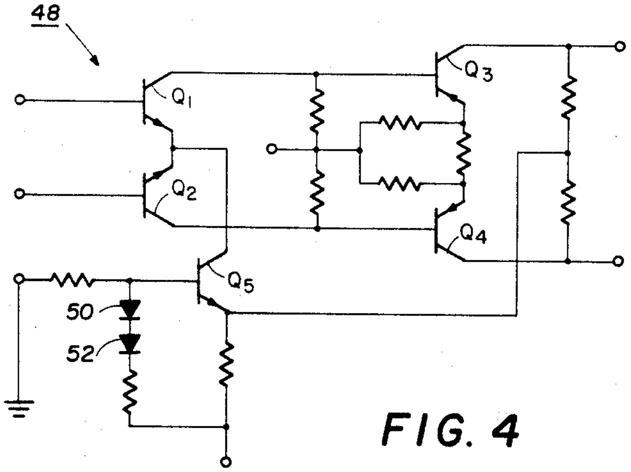
FIGURE 4 is a schematic circiut diagram of a typical differential operational amplifier which might be formed on the integrated circuit of FIGURE 2 and maintained at the predetermined temperature.

The temperature sensitive components of the circuit to be stabilized are located in the control zone 42. For example, the operational differential amplifier 48 shown in the schematic circuit diagram of FIGURE 4 has been stabilized using a temperature stabilized substrate. This circuit includes a pair of matched differential input transistors $Q_1$ and $Q_2$, a pair of matched differential output transistors $Q_3$ and $Q_4$, and a transistor $Q_5$ which provides a constant current source for the input pair $Q_1$ and $Q_2$. Additionally, diodes 50 and 52 provide a reference voltage for operating transistor $Q_5$. Transistors $Q_1$–$Q_4$ are very sensitive to changes in temperature and hence would normally be located in the temperature control zone 42. Transistor $Q_5$ and diodes 50 and 52 might also be located in the control zone while the resistors of the circuit 48, as well as the resistors and transistors of the control circuit 10, would typically be located in the region 54 on the substrate.

During normal operation of the control circuit 10, the voltage drop across the diodes $D_1$–$D_{16}$ decreases as the temperature of the diodes increases. Since the voltage at reference point $V_R$ remains substantially constant as a result of Zener diode 20, the base of transistor 24 becomes more positive as the substrate is heated so that transistors 24 and 26 conduct more heavily.

This causes the voltage at the output $V_O$ of the amplifier to decrease, thus decreasing the current through the heater transistors $H_1$–$H_7$ and permitting the substrate to cool. On the other hand, as the substrate cools below the desired temperature, the voltage drop across the diodes $D_1$–$D_{16}$ increases, thus lowering the potential at the base of transistor 24 and raising the potential at the output $V_O$. This increases the current through the heater transistors $H_1$–$H_7$ and increases the temperature of the substrate.

When the temperature control circuit 10 is first energized, the substrate 40 is typically at room temperature, which is substantially below the temperature at which the substrate is maintained during normal operation. As a result, the voltage drop across diodes $D_1$–$D_{16}$ is relatively high, the input voltage to the amplifier section 14 is relatively low, and the output voltage $V_O$ is at such a high voltage that the heater transistors $H_1$–$H_7$ are sometimes saturated. Then the heater end of the substrate is immediately heated to a very high temperature before the temperature can propagate the length of the substrate to the sensing diodes $D_1$–$D_{16}$. Once the temperature has reached the diodes, it is sometimes too high for the sensor circuit and amplifier circuit to compensate, which results in a thermal runaway which destroys the substrate 40.

In accordance with the present invention, the current through the heater transistors $H_1$–$H_7$ is initially limited by means of a start-up transistor 60. The collector of transistor 60 is connected to the collector voltage supply, the base is connected to the output $V_O$ of the amplifier, and the emitter is connected between the twelfth and thirteenth diodes of the sixteen diodes $D_1$–$D_{16}$.

As a result of transistor 60, when the substrate 40 is at a relatively low ambient temperature and the control circuit 10 is energized, the output voltage $V_O$ will initially be limited to a relatively low value which is substantially equal to the sum of the base-emitter voltage drop of transistor 60, the voltage drop across diodes $D_{12}$–$D_{16}$, and the base-emitter voltage drop of transistors 24 and 26. This total is typically about 3.5 volts which is sufficiently low to limit the current through the heater transistors $H_1$–$H_7$ to a safe level.

After the thermal energy from the heater transistors $H_1$–$H_7$ has propagated through the substrate to the sensor diodes $D_1$–$D_{16}$, the voltage drop across each of the sensor diodes $D_1$–$D_{12}$ decreases. As a result of the decrease in the voltage drop across diodes $D_1$–$D_{12}$, the potential at the base of transistor 60 increases. The potential at the base of transistor 24 also increases so that the output voltage $V_O$ decreases. At some point the base-emitter junction of transistor 60 becomes reverse biased so that transistor 60 is removed from the circuit and the control circuit then operates in the manner heretofore described to keep the control zone 42 at the desired stable temperature.

In one embodiment of the invention fabricated on a silicon substrate, the output $V_O$ of the amplifier, and thus the base of transistor 60, is typically at about 4.0 volts when the circuit is energized, while the emitter is at about 3.2 volts. As the substrate is heated, the emitter of transistor 60 decreases to about 2.5 volts while the output $V_O$, and thus the base of transistor 60, decreases to less than about 2.0 volts. Although the transistor 60 tends to limit the minimum ambient temperature in which the temperature of the control region 42 can be maintained within the desired limits, it has been found that this lower temperature is well within the normal design limits so that the overall effectiveness of the circuit is not affected.

Although a preferred embodiment of the invention has been described in detail, it is to be understood that various changes, substitutions and alterations can be made therein without departing from the spirit and scope of the invention as defined by the appended claim.

What is claimed is:

1. In an automatic temperature control circuit for a temperature stabilized substrate or the like comprising a plurality of sensing diodes in heat exchange relationship with the substrate and connected in series with a resistance across a reference voltage for producing a voltage at the junction between the diodes and the resistance proportional to the temperature of the diodes, a transistor amplifier having an input coupled to the junction between the diodes and the resistance and an inverting output, and heater means having an input coupled to the output of the amplifier for heating the substrate in proportion to the output of the amplifier, the improvement comprising:

a transistor the collector of which is connected to a supply voltage, the base of which is connected to the output of the amplifier, and the emitter of which is connected to the series of diodes at a point such that the number of diodes between the emitter and the input of the amplifier results in a maximum voltage at the output of the amplifier sufficiently low to limit the output of the heater means to a safe level when the diodes are relatively cold and such that the number of diodes between the emitter and the reference voltage provides a sufficiently greater voltage drop when the diodes are cold to place the emitter of the transistor at a potential such that the base-emitter of the transistor will be forward biased and a sufficiently small voltage drop when the diodes approach the stabilized temperature that the base-emitter junction of the transistor will be reverse biased.

References Cited

UNITED STATES PATENTS

| | | | |
|---|---|---|---|
| 3,303,386 | 2/1967 | Murphy | 307—88.5 X |
| 3,308,271 | 3/1967 | Hilbiber | 219—501 |
| 3,341,785 | 9/1967 | Merry | 330—24 X |

ROBERT A. O'LEARY *Primary Examiner.*

W. E. WAYNER, *Assistant Examiner.*